United States Patent

[11] 3,579,114

[72] Inventors Tokinori Kozawa
Kokubunji-shi;
Noboru Kuzuma; Ichiro Miwa, Tokyo, Japan
[21] Appl. No. 747,237
[22] Filed July 24, 1968
[45] Patented May 18, 1971
[73] Assignee Hitachi, Ltd.
Tokyo-to, Japan
[32] Priority Aug. 21, 1967, Sept. 18, 1967
[33] Japan
[31] 42/53259 and 42/59449

[54] AUTOMATIC GAIN CONTROL SYSTEM RADIO RECEIVERS AND THE LIKE
14 Claims, 4 Drawing Figs.

[52] U.S. Cl. .......... 325/410, 325/405
[51] Int. Cl. .......... H04b 1/16
[50] Field of Search .......... 325/400, 405, 408, 409, 410, 411, 413—415; 307/(Inquired)

[56] References Cited
UNITED STATES PATENTS
3,247,463 4/1966 Sennhenn .......... 325/415
2,949,533 8/1960 Read .......... 325/411
3,267,388 8/1966 Finkey et al. .......... 325/410
3,328,714 6/1967 Hugenholtz .......... 325/410

*Primary Examiner*—Robert L. Griffin
*Assistant Examiner*—Albert J. Mayer
*Attorneys*—Paul M. Craig, Jr., Donald R. Antonelli and Craig and Antonelli

ABSTRACT: One of a pair transistors forming a differential-type amplifier and controlled by an additional transistor whose collector is connected with the common emitters of the pair of transistors, is controlled by an automatic gain control signal obtained from the output of a semiconductor detection device, so as to adjust the current flow through the other one of the pair of transistors. The potential difference between the respective bases of the pair of transistors is defined by the offset voltage across the semiconductor detection device, thereby the operating point of the differential-type amplifier can be determined adequately.

INVENTORS
TOKINORI KOZAWA
NOBORU KOZUMA
ICHIRO MIWA

BY Craig, Antonelli, Stewart & Hill
ATTORNEYS

INVENTORS
TOKINORI KOZAWA
NOBORU KOZUMA
ICHIRO MIWA

BY Craig, Antonelli, Stewart & Hill
ATTORNEYS

AUTOMATIC GAIN CONTROL SYSTEM RADIO RECEIVERS AND THE LIKE

This invention relates to an automatic gain control system, and more particularly to an improved automatic gain control system adapted for radio receivers and the like in which so-called integrated circuit components are utilized for forming the required electronic circuits.

For the purpose of automatic gain control, it has heretofore been proposed to use a certain type of cascode amplifier. This type of control system is provided, for instance, with a first NPN transistor to which an input high frequency signal to be controlled is applied, a second NPN transistor connected with the first transistor so as to form a cascode amplifier with both transistors, and a third transistor whose emitter is connected with the emitter of second transistor so as to form a differential-type amplifier therewith. The second transistor is directly controlled by the collector current of the first transistor to develop an amplified output signal at the collector circuit thereof. An automatic gain control signal (hereinafter called an AGC signal) is produced from the output of a second detector and applied to the base of the third transistor. While the level of the AGC signal is substantially null, the third transistor is kept in the cutoff state thereof, and then almost the whole collector current of the first transistor passes through the second transistor. With an increasing of the level of the AGC signal, the third transistor becomes conductive, and a part of the collector current of the first transistor begins to flow through the third transistor. Consequently, the collector current through the second transistor tends to decrease by the amount of electric current through the third transistor. Since this reduction is proportional to the level of the AGC signal applied to the third transistor, the gain of the cascode amplifier composed of the first and second transistors can be controlled by the third transistor.

In the conventional radio receivers, however, the AGC signal is produced by extracting a carrier current level signal from the output of the second detector arranged after the intermediate frequency amplifying stage. On the other hand, the electrical potential at the emitter electrode of the third transistor is equal to the potential at the collector electrode of the first transistor, which is relatively high in comparison with the mean level of the AGC signal. Accordingly, it is required to increase such level by suitable means. Furthermore, it is desireable, in general, that the control system is operative only when the AGC signal exceeds a predetermined value. For this purpose, it is required that the base potential of the third transistor is surely kept lower than that of the emitter potential thereof while the level of the AGC signal is lower than a predetermined value.

Accordingly, a general object of the present invention is to satisfy the above-mentioned requirements.

A specific object of the present invention is to provide an automatic gain control system in which the operating point of a transistor for controlling the gain of a cascode amplifier can be exactly determined.

Another specific object of the present invention is to provide an automatic gain control system which is operative only when an automatic gain control signal exceeds a predetermined value.

Still another object of the present invention is to provide an automatic gain control system which is especially adapted for radio receivers and the like composed of so-called integrated circuit components.

A further object of the present invention is to provide an automatic gain control system in which as offset voltage produced in a semiconductor detection element is effectively utilized as a bias voltage for determining the operating point of the system.

These, as well as additional objects and advantages of the present invention will become more apparent from the following description when taken in connection with the accompanying drawing, in which.

Figure 1:
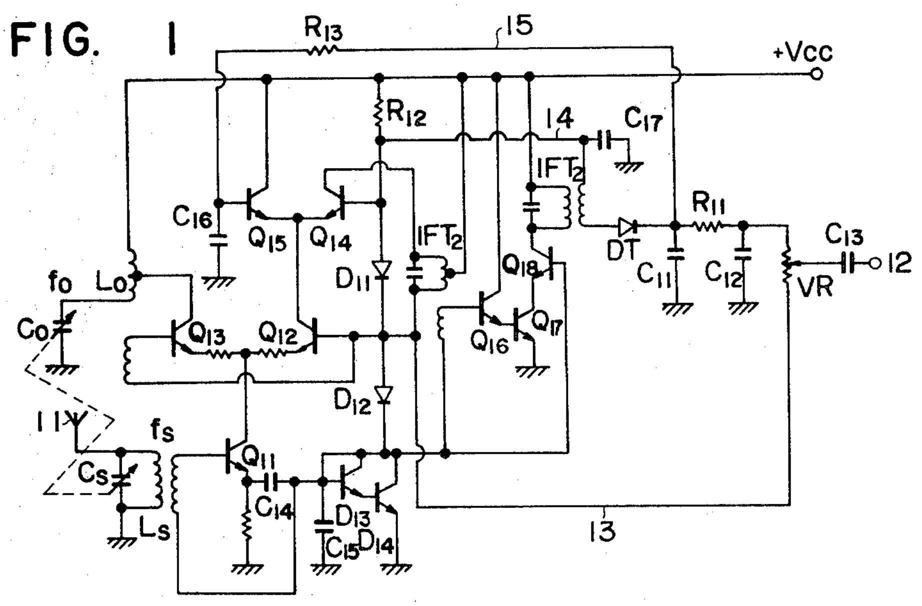
FIG. 1 is a circuit diagram showing one embodiment of the present invention.

Referring now to FIG. 1 showing one embodiment of the present invention, reference numeral 11 indicates a receiving antenna which is coupled with an input tank circuit composed of an inductance coil $L_s$ and a variable capacitor $C_s$. A radiofrequency signal tuned to the resonant frequency $f_s$ of the tank circuit $L_sC_s$ is applied to and amplified by a transistor $Q_{11}$ and then introduced to a frequency converter circuit of the differential amplifier type composed of two transistors $Q_{12}$ and $Q_{13}$. The transistor $Q_{13}$ forms a local oscillation circuit in company with a series resonance circuit composed of an inductance coil $L_o$ and a capacitor $C_o$. The local oscillation frequency $f_o$ produced by this circuit is mixed with the radiofrequency signal $f_s$ through the transistor $Q_{12}$ to obtain an output of intermediate frequency $f_i$. The detail of this frequency converter circuit has been disclosed in the specification of a patent application, Ser. No. 709,092, filed by Tokinori Kozawa on Feb. 28, 1968, claiming the convention priority of Mar. 1, 1967 in Japan, titled "Frequency Converter Circuit" and assigned to the same assignee of the present application.

A transistor designated by reference $Q_{14}$ is used for amplification of the intermediate frequency signal $f_i$ and is directly controlled by the transistor $Q_{12}$. Thus, both transistors compose a so-called cascode amplifier. A transistor $Q_{15}$ is used for gain control for the above cascode amplifier. This transistor forms a differential-type amplifier with the transistor $Q_{14}$.

Moreover, in the FIG., references $IFT_1$ and $IFT_2$ designate intermediate frequency transformers; $Q_{16}$, $Q_{17}$ and $Q_{18}$ are transistors for amplification of the intermediate frequency; DT is a semiconductor diode used for a second detector; and $R_{11}$, $C_{11}$ and $C_{12}$ are a resistor and capacitors forming a filter circuit for eliminating high frequency components included in the output of the diode, respectively. The circuit arrangement composed of these circuit elements forms the well-known intermediate frequency amplification stage and second detection stage. Besides, reference VR is a variable resistor for volume control and $C_{13}$ is a coupling capacitor, from a terminal 12 of which a sound output is derived and applied to an audiofrequency stage (not shown). Further, elements $R_{12}$, $D_{11}$, $D_{12}$, $D_{13}$ and $D_{14}$ are solid resistor and semiconductor voltage stabilizing elements, connected in series with each other to form a voltage dividing circuit for applying desired bias potentials to the respective portions of the circuit arrangement. Elements $C_{14}$, $C_{15}$, $C_{16}$ and $C_{17}$ are coupling or bypass capacitors.

If it is now assumed that a conductor 13 coupling between the base of the transistor $Q_{12}$ and the lower terminal of the variable resistor VR, and a conductor 14 coupling between the base of the transistor $Q_{14}$ and the bypass capacitor $C_{17}$ are omitted, and that the lower terminal of the resistor VR is grounded, the intermediate frequency signal $f_i$ obtained from the secondary winding of the transformer $IFT_2$ is detected by the detector DT, and the audiofrequency signal can be obtained from the terminal 12. At the same time, the carrier level signal is produced on the side of the cathode of the detector DT, and this signal is applied to the base electrode of the transistor $Q_{15}$ as an automatic gain control signal by way of the conductor 15 and the resistor $R_{13}$. As shown in the FIG., since the transistors $Q_{11}$, $Q_{12}$ and $Q_{14}$ are connected with each other to form a cascode amplifier, the collector potential of the transistor $Q_{12}$ (i.e. the emitter potential of the transistor $Q_{15}$ ) is relatively high ( about 2 to 3 volts). This means the transistor $Q_{15}$ is substantially inoperative, even if the AGC signal, which is smaller than 2 volts in general, is applied to the transistor $Q_{15}$.

In case of the present invention, as shown in FIG. 1, the base electrode of the transistor $Q_{12}$ is connected with the variable resistor VR through the conductor 13, and the base electrode of the transistor $Q_{14}$ is connected with the anode of the detector DT through the conductor 14. As a result of this circuit arrangement, a constant current (about 5 to 500 microamperes in general), which is substantially determined by the series resistance value of the resistors $R_{11}$ and VR, flows through the detector DT in the forward direction thereof. Consequently, an offset voltage (about 0.6 volts in the case of a silicon diode and about 0.2 volts in the case of a germanium diode) is produced across the diode DT.

Figure 4:
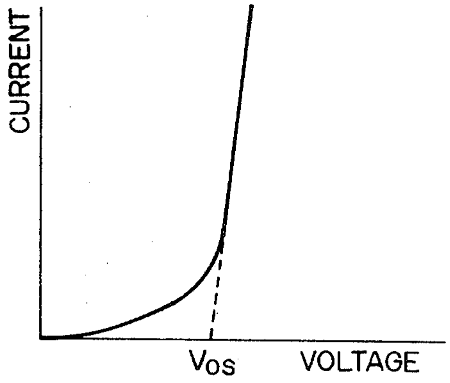
FIG. 4 shows a voltage to current characteristic of conventional semiconductor detectors.

FIG. 4 illustrates a voltage to current characteristic of conventional semiconductor diodes, shown in linear scale. As shown in the FIG., the semiconductor diode tends to exhibit a nonlinear characteristic, but this characteristic curve includes a portion wherein the current through the diode tends to increase linearly with the increase of the voltage applied thereto. The offset voltage is given, in general, by a cross point $V_{os}$ of the horizontal axis of the FIG. and a straight line extended from the substantially linear portion of the characteristic curve. Though the voltage value actually produced across the detector diode DT in FIG. 1 slightly differs from this offset voltage, such actual voltage is hereinafter referred to as "offset voltage" for simplification of explanation. According to our experiments, the offset voltage in the case of a silicon diode is kept substantially constant (about 0.6 volts) when a current of 5 to 500 microamperes is supplied through the diode.

Referring again to FIG. 1, the offset voltage produced across the diode DT is applied between the bases of the respective transistors $Q_{14}$ and $Q_{15}$ through the respective conductors 14 and 15. Consequently, the base potential of the transistor $Q_{15}$ is kept lower than the base potential of the transistor $Q_{14}$ by the value equal to the above offset voltage when no signal is received. Thus the transistor $Q_{15}$ is surely kept in the cutoff state thereof at this time. On the other hand, this transistor $Q_{15}$ becomes operative to control the gain of transistor $Q_{14}$ when a signal in excess of the above offset voltage is received.

In the radio receivers composed of integrated circuit components, it is desirable that the semiconductor detector DT is formed of a silicon diode because the offset voltage thereof is most adaptable for the base bias voltage of the gain control transistor $Q_{15}$. Moreover, it is also desirable that the diode $D_{11}$ for voltage division is formed of a silicon diode. Such diode serves to produce a substantially fixed offset voltage of about 0.7 volts when a forward current of about 1 milliampere flows therethrough. Accordingly, it is possible to keep the current through the detector DT at a certain constant value by using such diode for the element $D_{11}$. However, it is also possible to substitute a conventional solid resistor for the element $D_{11}$ because the current value through the detector DT is substantially determined by the total value of the resistors $R_{11}$ and VR which is relatively large in general in comparison with the forward resistance value of the element DT. This forward resistance value is determined by the inclination of the straight portion of the curve shown in FIG. 4, and is relatively small. Furthermore, the offset voltage across the element DT can be kept at a substantially constant value by selecting the current therethrough largely to some extent.

In the embodiment shown in FIG. 1, though the lower terminal of the variable resistor VR is connected to the base of the transistor $Q_{12}$, this is not essential for the purpose of the present invention. In most cases, it is possible to ground the variable resistor VR directly or through a suitable resistor. It is essential, however, to satisfy the object of the present invention that the anode of the semiconductor detector DT is coupled with the base electrode of the transistor $Q_{14}$ to provide a direct-current component, thereby to supply the forward current to the detector for producing the required offset voltage which is used for the base bias voltage of the transistor $Q_{15}$.

Though the above embodiment is composed of NPN type transistors, it will be apparent that an automatic gain control system having the same function can be also composed of PNP transistors.

Figure 2:
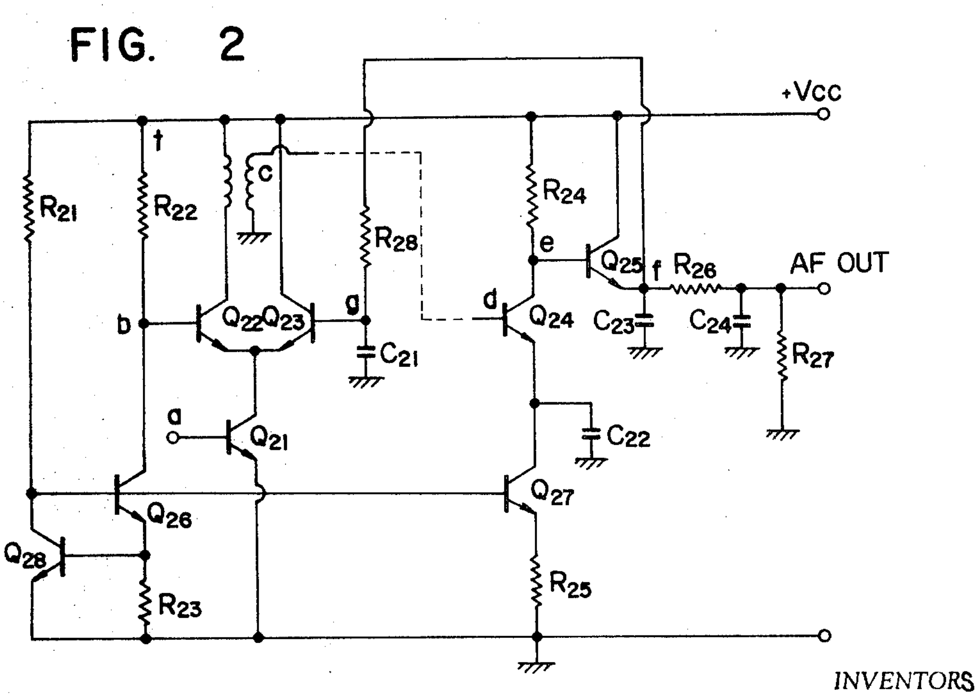
FIGS. 2 and 3 are circuit diagrams showing two different embodiments which are modifications of the embodiment shown in FIG. 1.

FIG. 2 illustrates one modification of the embodiment of FIG. 1, in which reference $Q_{21}$ indicates a transistor whose emitter is grounded. A received signal (radio or intermediate frequency signal) is applied to the base electrode of the transistor $Q_{21}$ through an input terminal *a*. References $Q_{22}$ and $Q_{23}$ indicate two transistors which form a differential-type amplifier. The emitter electrodes of both transistors are commonly connected with each other, and directly connected to the collector electrode of the transistor $Q_{2}1$. Reference $Q_{24}$ indicates a last transistor in a high frequency amplification stage (radio or intermediate frequency band). Reference T is a coupling transformer inserted into the collector circuit of the transistor $Q_{22}$.

This embodiment is shown in a typical form, to which various modifications thereof can be constituted, as will become apparent from the following description. For instance, one terminal *c* of the secondary winding of the transformer T can be connected with the base terminal *d* of the transistor $Q_{24}$ directly, or through one or more intermediate frequency amplifiers, in the case wherein the received signal applied to the transistor $Q_{21}$ through the terminal *a* has been converted into the intermediate frequency band. On the other hand, in the case wherein the received signal is the radiofrequency band, a frequency converter circuit and one or more intermediate frequency amplifiers are inserted between the terminals *c* and *d*. It is also possible to insert the frequency converter circuit between the transistors $Q_{21}$ and $Q_{22}$, and such modification has been disclosed in the specification of the above-mentioned prior application, as described in connection with FIG. 1.

Reference $Q_{25}$ shows an NPN type transistor forming an emitter-follower type detector, whose base electrode is connected with the collector of the transistor $Q_{24}$, directly. Reference $Q_{26}$ shows a transistor which is inserted between the base of the transistor $Q_{22}$ and the earth potential so as to operate as a constant current source. Reference $Q_{27}$ shows a similar transistor which is inserted between the emitter of the transistor $Q_{24}$ and the earth potential. Both transistors $Q_{26}$ and $Q_{27}$ include emitter resistances $R_{23}$ and $R_{25}$, respectively. A transistor $Q_{28}$ is provided for controlling the constant current transistors $Q_{26}$ and $Q_{27}$, whose collector is connected with a positive terminal $+V_{cc}$ through a resistor $R_{21}$, and whose emitter is grounded as shown in the FIG. The collector of the transistor $Q_{28}$ is further connected with the base electrodes of the transistors $Q_{26}$ and $Q_{27}$, and the base thereof is connected with the emitter electrode of the transistor $Q_{26}$.

The base electrode of the transistor $Q_{22}$ is connected with the positive terminal $+V_{cc}$ through a resistor $R_{22}$, and the collector thereof is connected with the same terminal through the primary winding of the transformer T. The collector electrode of the transistor $Q_{23}$ is connected with the positive terminal directly. The collector of the transistor $Q_{24}$ is connected with the positive terminal through a resistor $R_{24}$. The emitter electrode of the transistor $Q_{25}$ is connected with the base electrode of the transistor $Q_{23}$ through a resistor $R_{28}$. Reference $C_{21}$ identifies a bypass capacitor connected between the base of the transistor $Q_{23}$ and earth potential. A bypass capacitor $C_{22}$ is also connected between the collector of the transistor $Q_{27}$ (i.e. the emitter of the transistor $Q_{24}$) and the earth potential for preventing an alternating current component in the circuit of the transistor $Q_{27}$. Besides, references $R_{26}$, $C_{23}$ and $C_{24}$ represent a resistor and capacitors forming a well-known low frequency band filter, and reference $R_{27}$ is a load resistor for the transistor $Q_{27}$ from which an audiofrequency output signal can be derived.

The differential-type amplifier composed of the transistors $Q_{22}$ and $Q_{23}$ is controlled by an automatic gain control signal applied between the point *g* and earth potential with reference to a constant voltage generated between the point *b* and earth potential. It is now assumed that the value of the resistor $R_{22}$ is equal to that of the resistor $R_{24}$, and that the respective currents through both resistors are controlled equally by means of the transistors $Q_{26}$ and $Q_{27}$. In this case, no potential difference is developed between the base of the transistor $Q_{22}$ (the point *b*) and the base of the transistor $Q_{25}$ (the point *e*), and this condition is not influenced by the variation in the direct-current power source.

Similarly to the case of FIG. 1, a forward bias current passes from the base to the emitter of the transistor $Q_{25}$, and an offset voltage is developed between the base and emitter of the transistor $Q_{25}$ which is about 0.6 volts (in case of silicon transistor) in spite of the variation in the load current thereof. Accordingly, if the voltage drop across the resistor $R_{28}$ can be neglected, the direct-current potential on the base of the transistor (the point *g*) is kept lower than the point *b* by about 0.6 volts when no signal is received. Thus, in the case wherein the detected level of the carrier wave developed at the emitter of the transistor $Q_{25}$ is less than the above offset voltage (about 0.6 volts), the transistor $Q_{23}$ is kept inoperative. However, when the above-detected level exceeds the offset voltage, the transistor $Q_{23}$ becomes conductive, and then a part of the collector current of the transistor $Q_{21}$ flows through the transistor $Q_{23}$. Consequently, the current through the transistor $Q_{22}$ reduces by the amount of current through the transistor $Q_{23}$. Since this reduction is proportional to the AGC signal (the detected level of the carrier wave), the output signal derived from the transistor $Q_{22}$ can be controlled at a certain constant value.

The transistor $Q_{28}$ operates in accordance with the voltage developed across the resistor $R_{23}$ so as to maintain the currents through the transistors $Q_{26}$ and $Q_{27}$ at a certain constant value. The detail of this operation is omitted from the description in this specification because it is not a direct part of the object of the present invention and should be evident from the illustrated circuitry. It is of course possible to use various changes or modifications of the circuit shown in the figure as the current-stabilizing circuit. In the case of the embodiment of FIG. 2, it is advantageous, especially when the circuit is composed of integrated circuit components, that the value of the resistor $R_{23}$ is selected to be equal to that of the resistor $R_{25}$. According to the so-called integrated circuit technology, resistance elements produced by diffusing a suitable impurity element into a silicon wafer are dispersive in the absolute value thereof to the extent of about 10 percent, but the dispersion in the ratio of resistance is 3 percent at most. Accordingly, if such a condition as $R_{23}=R_{25}$, (additionally, $R_{22}=R_{24}$) is selected, it becomes possible to reduce the dispersion in the characteristics for automatic gain control. Thus, it is unnecessary to accurately set the values of the respective resistors $R_{22}$, $R_{23}$, $R_{24}$ and $R_{25}$. The condition $R_{22}=R_{24}$ or $R_{23}=R_{25}$ is, of course, not essential in general cases, because it is possible to adjust the detected carrier level by adequately changing these resistance values.

Figure 3:
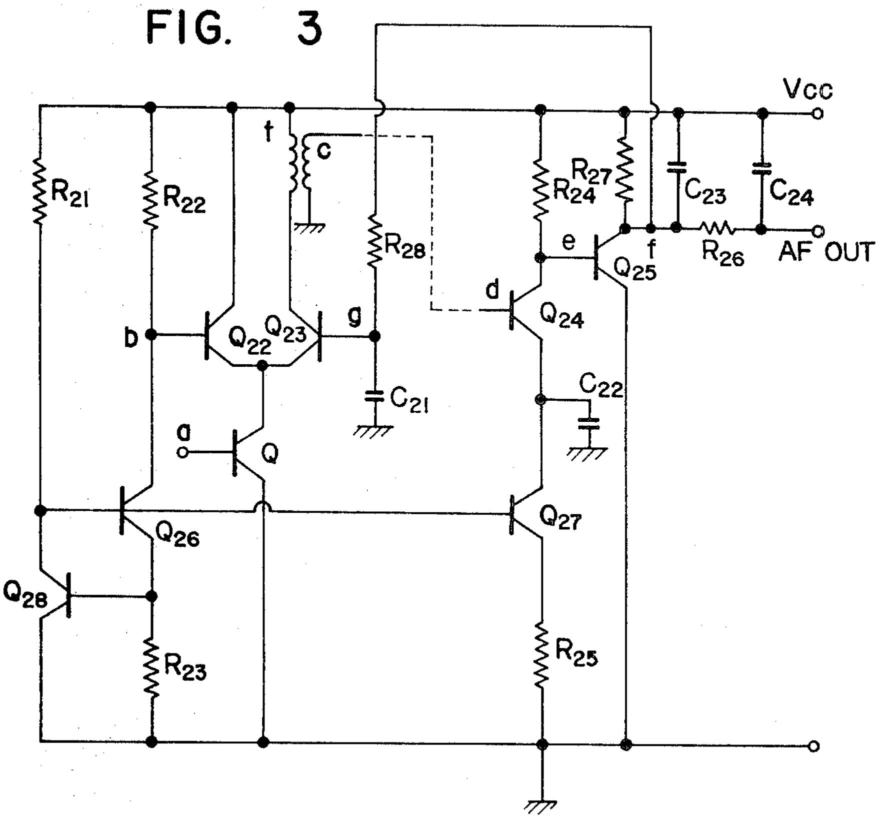

In FIG. 3, an embodiment in which a PNP transistor $Q_{25a}$ is used for the emitter-follower detector is illustrated. The same references as those in FIG. 2 show the same parts or components. In this embodiment, the coupling transformer T is connected with the collector of the transistor $Q_{23}$, but the function of the circuit is quite similar to FIG. 2. When no signal is received, the potential on the base electrode of the transistor $Q_{23}$ is kept higher than the base potential of the transistor $Q_{22}$ by the value determined by the offset voltage between the base and emitter of the transistor $Q_{25a}$. When the value of the AGC signal exceeds the offset voltage, the potential on the base of the transistor $Q_{23}$ is reduced lower than the base potential of the transistor $Q_{22}$, and the latter transistor becomes conductive to control the gain of the former transistor.

While I have shown and described only a few embodiments of the present invention, it will be understood that the invention is not limited thereto but is susceptible of numerous changes and modifications as known to a person skilled in the art, and, I therefore do not wish to be limited to the details shown and described herein but intended to cover such modifications and changes as are within the scope of the appended claims.

We claim:

1. In an apparatus for receiving and detecting a modulated carrier wave high frequency signal, an automatic gain control system comprising:
a pair of transistors whose emitters are commonly connected to each other to form a differential-type amplifier;
an additional transistor whose collector is connected with the common emitters of said pair of transistors to directly control said pair of transistors;
means for applying a received high frequency signal between the base and emitter of said additional transistor;
a semiconductor detection device;
means for supplying a forward bias current through said semiconductor detection device to produce an offset voltage thereacross;
means for applying a potential difference, defined by said offset voltage across said semiconductor detection device, between the respective bases of said pair of transistors to set one of these transistors in cutoff state thereof when no high frequency signal is received;
means connecting the output from the other one of said pair of transistors to said semiconductor detection device for applying an amplified high frequency signal thereto; and
means for applying a carrier level signal derived from the output of said semiconductor detection device to the base of said one of said pair of transistors to vary the potential difference between the respective bases of said pair of transistors, thereby to control the effective gain of the said other transistor when in the conductive state in accordance with the carrier level signal.

2. An automatic gain control system according to claim 1 wherein said semiconductor detection device is provided as a semiconductor diode.

3. An automatic gain control system according to claim 2 wherein said semiconductor diode is a silicon diode.

4. An automatic gain control system according to claim 2 wherein said means for applying a potential difference between the respective bases of said pair of transistors includes first means electrically connecting the base of said one of said pair of transistors to the cathode of said diode, second means electrically connecting said other one of said pair of transistors to the anode of said diode, and third means for applying a constant bias potential to the base of said other one of said pair of transistors.

5. An automatic gain control system according to claim 4 wherein said semiconductor diode is a silicon diode.

6. An automatic gain control system according to claim 4 wherein said forward bias-current supplying means is provided with a voltage stabilizing element connected between the base of said other one of pair of transistors and the base of said additional transistor, and a series circuit connected in parallel across said voltage stabilizing element including a series connection of said semiconductor diode a filter circuit and a variable resistor for volume control.

7. An automatic gain control system according to claim 1 wherein said semiconductor detection device is composed of an emitter-follower type detection circuit.

8. An automatic gain control system according to claim 7 wherein said emitter-follower type detection circuit includes an NPN-type transistor.

9. An automatic gain control system according to claim 7 wherein said emitter-follower type detection circuit includes a PNP-type transistor.

10. An automatic gain control system according to claim 7 wherein said means for applying a potential difference between the respective bases of said pair of transistors includes first means for applying a constant bias potential to the base of said one of said pair of transistors, second means for applying a constant bias potential to the input of said emitter-follower type detection device, and third means for electrically connecting the emitter of said emitter-follower detection device to the base of the other one of said pair of transistors.

11. An automatic gain control system according to claim 10 wherein said pair of transistors and said additional transistor are NPN-type, and the transistor forming said emitter-follower type detection device is also NPN-type, and the amplified high frequency signal is derived from the collector circuit of said one of said pair of transistors.

12. An automatic gain control system according to claim 10 wherein said pair of transistors and said additional transistor are NPN-type, and the transistor forming said emitter-follower type detection device is PNP type, and the amplified high frequency signal is taken out from the collector circuit of said the other one of pair of transistors.

13. An automatic gain control system according to claim 10 wherein said first means includes a direct-current supply source, a first resistor connected between said source and said base of said one of said pair of transistors and a current stabilizing device for stabilizing the current through said resistor, and said second means includes a second resistor connected between said source and the base of said emitter-follower and a current stabilizing device for stabilizing the current through said resistor.

14. An automatic gain control system according to claim 13 wherein the values of said first and second resistors are equal.